United States Patent
Kagaya et al.

(10) Patent No.: US 7,935,576 B2
(45) Date of Patent: May 3, 2011

(54) SEMICONDUCTOR DEVICE AND MANUFACTURING METHOD OF THE SAME

(75) Inventors: Yutaka Kagaya, Tokyo (JP); Hidehiro Takeshima, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 0 days.

(21) Appl. No.: 12/285,719

(22) Filed: Oct. 14, 2008

(65) Prior Publication Data
US 2009/0096097 A1    Apr. 16, 2009

(30) Foreign Application Priority Data
Oct. 12, 2007 (JP) ................ 2007-266325

(51) Int. Cl.
H01L 21/50    (2006.01)
(52) U.S. Cl. ......... 438/124; 438/109; 257/678; 257/686
(58) Field of Classification Search .................. 257/678, 257/686, 777, 790, E23.068, E21.499; 438/109, 438/124
See application file for complete search history.

(56) References Cited

U.S. PATENT DOCUMENTS

| | | | | |
|---|---|---|---|---|
| 6,902,951 B2 * | 6/2005 | Goller et al. | ................ | 438/106 |
| 7,456,495 B2 * | 11/2008 | Pohl et al. | .................... | 257/686 |
| 2004/0061213 A1 * | 4/2004 | Karnezos | .................... | 257/686 |
| 2007/0241437 A1 * | 10/2007 | Kagaya et al. | ................ | 257/678 |

FOREIGN PATENT DOCUMENTS

JP    2004-172157    6/2004
JP    2004-273938    9/2004

* cited by examiner

*Primary Examiner* — Theresa T Doan
(74) *Attorney, Agent, or Firm* — McGinn IP Law Group, PLLC

(57) ABSTRACT

Semiconductor device 10 includes wiring substrate 11 including wiring 14 and wiring 15 in predetermined patterns, semiconductor chips 19 and 23 which are mounted on wiring substrate 11 with electrodes electrically connected to wiring 14 of wiring substrate 11 via wires 21 and 24, first sealing body 25 made of an insulative resin which is formed on a part of wiring substrate 11 and which covers semiconductor chips 19 and 23 and wires 21 and 24, a plurality of connecting connection pads 27 provided on the top surface of first sealing body 25, a plurality of connecting wires 26 which extend from the surface of wiring substrate 11, on which semiconductor chips 19 and 23 are mounted, to the top surface of first sealing body 25 via the side surfaces of first sealing body 25, and which electrically connect wiring 14 of wiring substrate 11 and the plurality of connecting connection pads 27 and second sealing body 28 made of an insulative resin which covers the plurality of connecting wires 26.

16 Claims, 11 Drawing Sheets

SEMICONDUCTOR DEVICE AND MANUFACTURING METHOD OF THE SAME

This application is based upon and claims the benefit of priority from Japanese patent application No. 2007-266325, filed on Oct. 12, 2007, the disclosure of which is incorporated herein in its entirety by reference.

BACKGROUND OF THE INVENTION

1. Field of the Invention

The present invention relates to a semiconductor device and a manufacturing method of the same, and particularly relates to a stacked type semiconductor device in which a semiconductor device is laid on a semiconductor device, and a manufacturing method of the same.

2. Description of the Related Art

As a package structure for achieving improvement in the degree of integration and reduction in size and weight of a semiconductor device, surface-mounting type semiconductor devices which are called BGA (Ball Grid Array) structures or LGA (Land Grid Array) structures are known. Each of the semiconductor devices is made up of a structure in which a semiconductor element (semiconductor chip) is fixed on a wiring substrate, the electrodes of the semiconductor chip and the connecting pads that are formed by wiring of the wiring substrate are connected with conductive wires (connecting means), and the semiconductor chip, the wire and the like are covered with a sealing body made of an insulative resin. Further, in order to improve productivity, a manufacturing method using a so-called collective mold method is adopted. In this manufacturing method, a wiring mother board on which product forming parts for producing semiconductor devices are arranged longitudinally and laterally is prepared. Thereafter, a semiconductor chip is fixed to each of the product forming parts, connection of wires is performed, the entire wiring mother board is further covered with an insulative resin, the wiring mother board together with the resin is cut longitudinally and laterally to produce a plurality of semiconductor devices.

Meanwhile, as methods for achieving improvement of the degree of integration and reduction in size of a semiconductor device, a method for stacking semiconductor chips in which ICs and the like are formed, and a method for stacking packaged semiconductor devices and the like are adopted. Such methods are disclosed in Japanese Patent Laid-Open No. 2004-172157 and Japanese Patent Laid-Open No. 2004-273938.

As a semiconductor device which is publicly well known, a resin seal type semiconductor device is cited. The semiconductor device is made up of a structure in which a semiconductor chip is mounted on the top surface of a wiring substrate including external electrode terminals on the undersurface, the electrodes of the semiconductor chip are electrically connected to the wiring of the wiring substrate via connecting means, and the semiconductor chip and the connecting means are covered with a sealing body (package) made of an insulative resin. When such a semiconductor device is stacked, for example, a method for manufacturing the stacked type semiconductor device by projecting the outer peripheral portion of the wiring substrate on which a part of the wiring is exposed to the outer side of the sealing body, and for connecting the external electrode terminals (solder bumps) of the semiconductor device (the semiconductor device in the upper layer), which is to be stacked, to the exposed wiring portion is conceivable.

In such a structure, when semiconductor chips in two layers are disposed to be stacked in the package of the semiconductor device in the lower layer, the height of the package increases. Therefore, when the bump electrode is formed by one solder ball, the height becomes insufficient, and the upper and lower semiconductor devices sometimes cannot be electrically connected. In this case, a method is conceivable, in which a substrate for stacking is disposed in the middle layer, solder balls are attached to the top and bottom of the substrate, and the upper and lower semiconductor devices are electrically connected.

However, in the stacked type semiconductor device of such a structure, the height of the stacked type semiconductor device increases, and a reduction in thickness of the stacked type semiconductor device is difficult to achieve. Further, the wiring substrate portion for connecting the bump electrode is required at the outer side of the package, and reduction in size of the stacked type semiconductor device becomes difficult to achieve.

Further, Japanese Patent Application No. 2006-113529 discloses a package-on-package stacked type semiconductor device which was studied by the present inventors, though it was not known at the time of filing the present application. The outline of it will be described as follows. A lower semiconductor device is configured by a wiring substrate which includes wiring in a predetermined pattern, at least one semiconductor chip which is mounted on the wiring substrate with electrodes electrically connected to the wiring of the wiring substrate via connecting means, a sealing body made of an insulative resin, which is formed on the wiring substrate and which covers the semiconductor chip and the connecting means, a plurality of lands provided on a top surface of the sealing body, and connecting wires which extend from the wiring pattern of the wiring substrate to the side surface and the top surface of the sealing body, which are electrically connected to the land parts. The stacked type semiconductor device is configured by mounting the external terminals of the upper semiconductor device on a plurality of lands provided on the top surface of the sealing body of the lower semiconductor device.

In such a stacked type semiconductor device, the connecting wires provided at the sealing part are configured to be exposed, the connecting wires are touched when the semiconductor device is handled in the selecting step and the step of mounting to the mounting substrate, and the connecting wire may be damaged or broken. Further, when a foreign matter or the like is attached onto the connecting wire of the stacked type semiconductor device in the above described steps, the connecting wire may be short circuited. Further, even after the stacked type semiconductor device is mounted on the mounting substrate and incorporated into an electronic device, a short circuit may occur in the connecting wires because the connecting wires are exposed.

Further, in the stacked type semiconductor device, the connecting wires are formed to be exposed on the sealing part, and therefore, when the stacked type semiconductor device is mounted on compact mobile devices or the like such as a cellular phone, the lands and the connecting wires may come off the sealing part as a result of the impact of falling or the like, and the issue of connection strength may become a problem. Therefore, there is the possibility of being unable to secure sufficient reliability of the stacked type semiconductor device.

SUMMARY

The present invention seeks to solve one or more of the above problems, or to mitigate those problems at least in part.

In order to attain the above-described objects, a semiconductor device of the present invention includes a wiring substrate that includes wiring in a predetermined pattern, at least one semiconductor chip which is mounted on the aforesaid wiring substrate with an electrode electrically connected to the aforesaid wiring of the aforesaid wiring substrate via connecting means, a first sealing body, which is made of an insulative resin formed on a part of the aforesaid wiring substrate and which covers the aforesaid semiconductor chip and the aforesaid connecting means, and which includes a top surface formed above the aforesaid semiconductor chip and side surfaces extending from the top surface to a surface of the aforesaid wiring substrate on which the aforesaid semiconductor chip is mounted, a plurality of connecting terminals provided on the aforesaid top surface of the aforesaid first sealing body, a plurality of connecting wires which extend from the surface of the aforesaid wiring substrate, on which the aforesaid semiconductor chip is mounted, to the aforesaid top surface via the aforesaid side surfaces of the aforesaid first sealing body, and which electrically connect the aforesaid wiring of the aforesaid wiring substrate and the aforesaid plurality of connecting terminals, and a second sealing body made of an insulative resin, which covers the aforesaid plurality of connecting wires.

Further, a method of manufacturing a semiconductor device of the present invention that includes mounting at least one semiconductor chip on a wiring substrate including a wiring in a predetermined pattern, electrically connecting an electrode of the aforesaid semiconductor chip to the aforesaid wiring of the aforesaid wiring substrate via connecting means, forming a first sealing body made of an insulative resin which covers the aforesaid semiconductor chip and the aforesaid connecting means in a state in which a part of the aforesaid wiring is exposed on a part of the aforesaid wiring substrate, and which includes a top surface formed above the aforesaid semiconductor chip and side surfaces extending from the top surface to a surface of the aforesaid wiring substrate on which the aforesaid semiconductor chip is mounted, providing a plurality of connecting terminals on the aforesaid top surface of the aforesaid first sealing body, providing a plurality of connecting wires which extend from the surface of the aforesaid wiring substrate, on which the aforesaid semiconductor chip is mounted, to the aforesaid top surface via the aforesaid side surfaces of the aforesaid first sealing body, and which electrically connect the aforesaid wiring of the aforesaid wiring substrate and the aforesaid plurality of connecting terminals, and forming a second sealing body made of an insulative resin, which covers the aforesaid plurality of connecting wires.

BRIEF DESCRIPTION OF THE DRAWINGS

The above features and advantages of the present invention will be more apparent from the following description of certain preferred embodiments taken in conjunction with the accompanying drawings, in which:

FIG. 11 is a sectional view showing the product forming part of the wiring mother board in the state in which a mask is formed on the first sealing body and the like;

FIG. 12 is a plane view showing the product forming part of the wiring mother board in the state in which the mask is formed on the first sealing body and the like;

DETAILED DESCRIPTION OF THE EXEMPLARY EMBODIMENTS

Next, exemplary embodiments will be described with reference to the drawings.

First Exemplary Embodiment

FIGS. 1 to 15C are views relates to a semiconductor device and a manufacturing method of the same of an exemplary embodiment. FIGS. 1 to 6 among them are views according to the structure of the semiconductor device, whereas FIGS. 7A to 15C are views according to the method of manufacturing the semiconductor device.

A stacked type semiconductor device is a semiconductor device in which semiconductor devices are stacked in multiple layers. In the exemplary embodiment, a semiconductor device on the lower side of the stacked type semiconductor device will be described.

Figure 1:
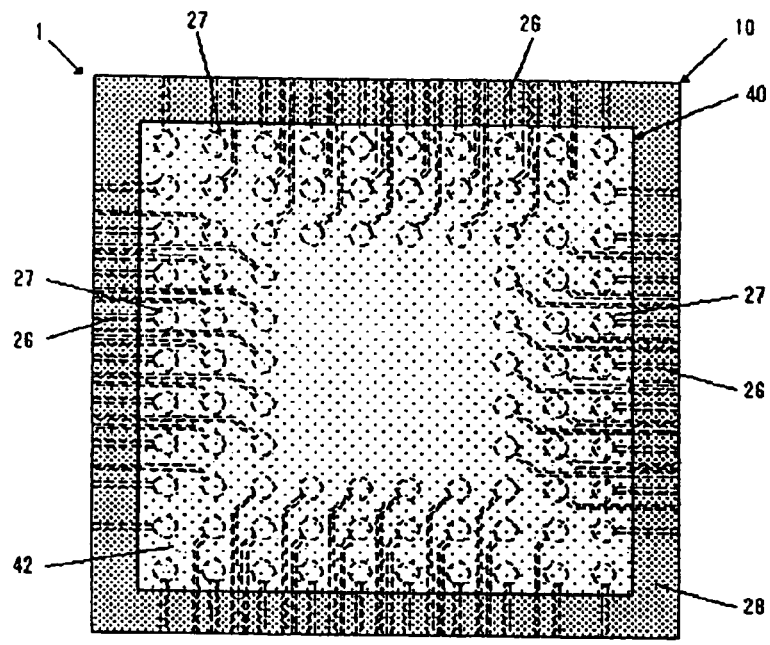
FIG. 1 is a plane view showing a semiconductor device according to a first exemplary embodiment.
Figure 2:
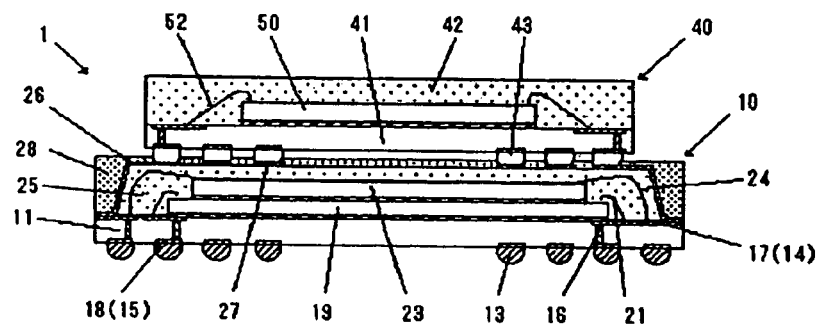
FIG. 2 is a side sectional view of the semiconductor device shown in FIG. 1.

Stacked type semiconductor device 1 in the exemplary embodiment includes semiconductor device 10 in a lower layer and semiconductor device 40 in an upper layer which is laid on semiconductor device 10 in the lower layer, as shown in FIGS. 1 and 2. Semiconductor device 10 in the lower layer includes, on its undersurface, external electrode terminals which are connected to a mounting substrate (wiring substrate) of any kind of electronic device, and includes, on its top surface, terminals to which external electrode terminals on an undersurface of semiconductor device 40 in the upper layer are connected. The semiconductor device of this structure is also called first semiconductor device 10 for convenience of explanation. Further, in semiconductor device 40 in the upper layer, the terminals which are provided to be exposed outside are the external electrode terminals on the undersurface of semiconductor device 40. The semiconductor device of this structure is called second semiconductor device 40 for convenience of explanation.

Figure 3:
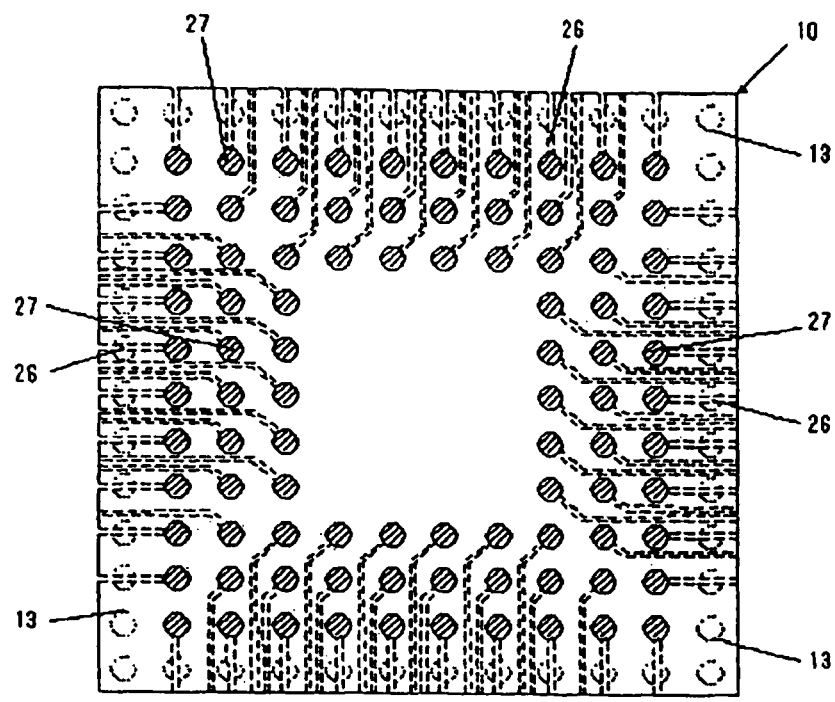
FIG. 3 is a plane view showing a first semiconductor device configuring the semiconductor device shown in FIG. 1.
Figure 4:
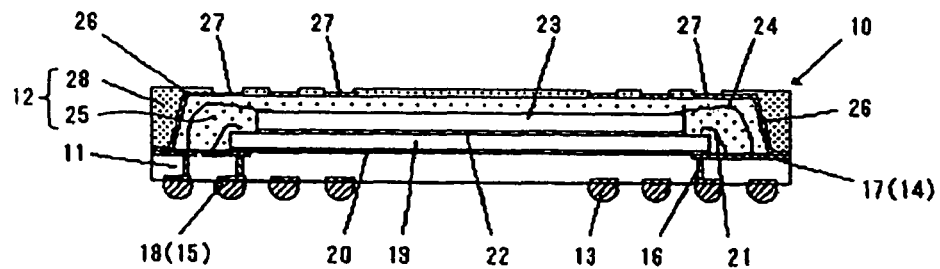
FIG. 4 is a side sectional view of the first semiconductor device shown in FIG. 3.

Semiconductor device (first semiconductor device) 10 in the lower layer is configured by wiring substrate 11 which has a square shape, sealing body 12 on a first surface (top surface) of wiring substrate 11, and electrodes (external electrode terminals) 13 formed on a second surface (undersurface in FIG. 4) which is a surface opposite to the first surface of wiring substrate 11, as shown in FIGS. 3 and 4. External electrode terminals 13 are provided in four rows along respective sides of square wiring substrate 11, as shown in FIGS. 1 and 2.

Wiring substrate 11 is formed from a glass/epoxy resin wiring substrate having a thickness of 0.25 mm, for example, and includes wiring 14 and wiring 15 in predetermined patterns on the first surface and the second surface as shown in FIG. 4. Wiring 14 and wiring 15 are connected with wiring 16 which penetrates between the top surface and the undersurface of wiring substrate 11. On the first surface and the second surface of wiring substrate 11, insulating films (solder resist films) are selectively provided, though not illustrated. Accordingly, wiring 14 and wiring 15 are partially exposed on the first surface and the second surface of wiring substrate 11. Wiring 14 which is exposed on the first surface becomes connection pads 17, and wiring 15 exposed on the second surface becomes terminal formation pads 18 for forming electrodes (external electrode terminals) 13.

First semiconductor chip 19 is mounted on the first surface of wiring substrate 11. First semiconductor chip 19 includes a first surface and a second surface which is a surface opposite to the-first surface, and the second surface is fixed to wiring substrate 11 via insulative adhesive agent 20. Electrodes are provided on the first surface of first semiconductor chip 19. These electrodes are provided along the respective sides of semiconductor chip 19 in the vicinity of the respective sides of square first semiconductor chip 19. These electrodes are electrically connected to some of connection pads 17 by conductive wire 21.

Further, second semiconductor chip 23 is fixed to the first surface of first semiconductor chip 19 via insulative adhesive agent 22. Second semiconductor chip 23 includes a first surface, and a second surface which is a surface opposite to the first surface, and the second surface of second semiconductor chip 23 is connected to first semiconductor chip 19. Electrodes are provided on the first surface (top surface) of second semiconductor chip 23. These electrodes are provided along respective sides of semiconductor chip 23 in the vicinity of the respective sides of square second semiconductor chip 23. These electrodes are electrically connected to some of connection pads 17 by conductive wire 24.

Sealing body 12 is configured by first sealing body 25 and second sealing body 28. First sealing body 25 is selectively provided on the first surface (top surface) of wiring substrate 11 to cover first semiconductor chip 19, second semiconductor chip 23, wires 21 and 24, and the like. In the exemplary embodiment, an outer peripheral portion of wiring substrate 11 includes a structure in which wiring 14 is projected outside from the edge of the outer periphery of first sealing body 25. First sealing body 25 is formed by transfer molding. First sealing body 25 is configured by a square top surface similar to wiring substrate 11 and side surfaces connected to respective sides of the top surface to reach the first surface (top surface) of wiring substrate 11, and has a structure like that of a square stand.

Further, part of wiring 14 is exposed to a portion of the first surface (top surface) of wiring substrate 11, which is projected from the edge of the outer periphery of first sealing body 25. Specifically, wiring 14 is exposed to a portion of wiring substrate 11, which is outside of first sealing body 25. At the exposed portion of the wiring, connecting wires 26 made of copper, for example, are formed by being overlaid on the exposed portion. Connecting wire 26 passes the side surfaces of first sealing body 25 from the first surface of wiring substrate 11 to extend to the top surface of first sealing body 25. Tip end portions of connecting wires 26, which extend to the top surface of first sealing body 25 form circular terminals which are called connecting connection pads 27 as shown in FIG. 3. Connecting connection pad 27 does not have to be necessarily circular, but may be another shape such as a square, for example.

Second sealing body 28 is provided on the first surface of wiring substrate 11 and first sealing body 25. Second sealing body 28 covers connecting wires 26 which pass side surfaces of first sealing body 25 from the top of the first surface of wiring substrate 11 to extend to the top surface of first sealing body 25. Second sealing body 28 is formed by transfer molding, and includes a structure in a square. Second sealing body 28 may be any sealing body if it only covers the connecting wiring, and may be formed by, for example, potting or the like. Second sealing body 28 is configured so as to cover the first surface of the wiring substrate and the top surface of first sealing body 25, but to expose connecting connection pads 27 provided on the top surface of first sealing body 25 as shown in FIG. 4. The external electrode terminals on the undersurface of semiconductor device 40 in the upper layer are connected to connecting connection pads 27 by being overlaid on connecting connection pads 27 thus exposed (see FIG. 2). Further, second sealing body 28 is configured to cover the periphery of the connecting connection pads, whereby the connecting connection pads can be configured to be difficult to remove.

Figure 5:
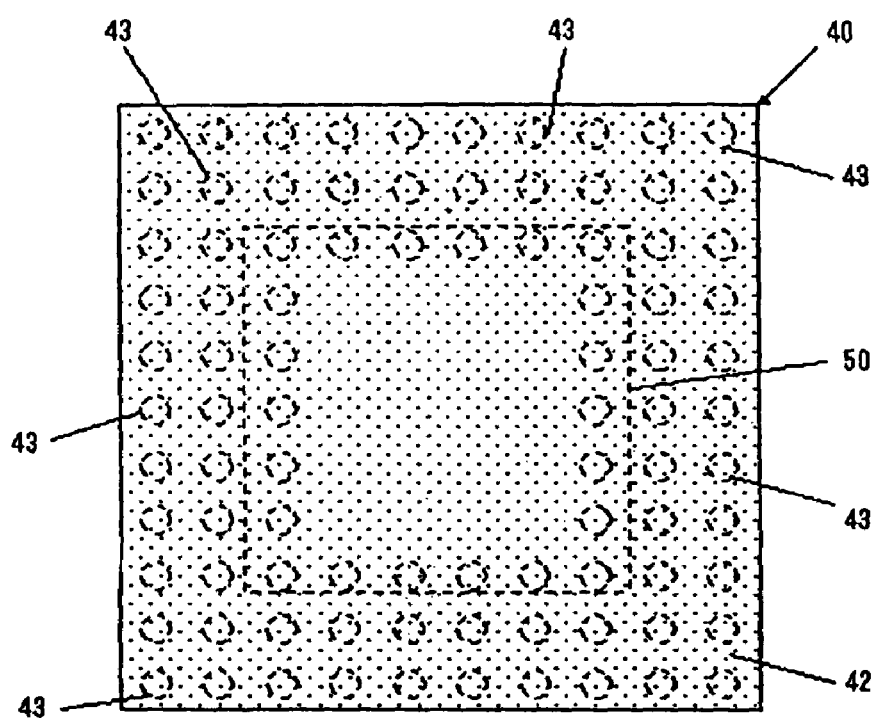
FIG. 5 is a plane view showing a second semiconductor device configuring the semiconductor device shown in FIG. 1.
Figure 6:
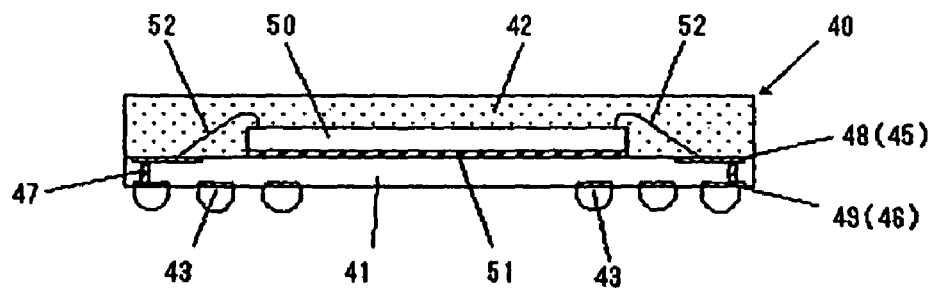
FIG. 6 is a side sectional view of the second semiconductor device shown in FIG. 5.

Semiconductor device (second semiconductor device) 40 in the upper layer is configured by wiring substrate 41 which has a square shape, square sealing body 42 which is formed by being overlaid on a first surface (top surface in FIGS. 7A to 7F) side of wiring substrate 41 to correspond to it, and electrodes (external electrode terminals) 43 formed on a second surface (undersurface) which is a surface opposite to the first surface (top surface) of wiring substrate 41, as shown in FIGS. 5 and 6. External electrode terminals 43 are provided in three rows along the respective sides of square wiring substrate 41, as shown in FIGS. 5 and 6.

Wiring substrate 41 is formed from a glass/epoxy resin wiring substrate having a thickness of 0.25 mm, for example, and includes wiring 45 and wiring 46 in predetermined patterns on the first surface (top surface) and the second surface (undersurface) as shown in FIG. 6. Wiring 45 and wiring 46 are connected with wiring 47 which penetrates between the top surface and undersurface of wiring substrate 41. Insulating films (solder resist films) are selectively provided on the first surface and the second surface of wiring substrate 41, though not illustrated. Accordingly, wiring 45 and wiring 46 are partially exposed on the first and the second surface of wiring substrate 41. Wiring 45 exposed on the first surface becomes connection pads 48, whereas wiring 46 exposed on the second surface becomes terminal formation pads 49 for forming electrode (external electrode terminal) 43.

Semiconductor chip 50 is fixed to the first surface (top surface) of wiring substrate 41 via insulating adhesive agent 51. Semiconductor chip 50 includes an electrode not illustrated on a first surface (top surface in FIGS. 7A to 7F). The electrodes and connection pads 48 of wiring substrate 41 are electrically connected by conductive wires 52.

Such semiconductor device 40 in the upper layer is stacked on semiconductor device 10 in the lower layer to form stacked type semiconductor device 1 as shown in FIG. 2. Stacked type semiconductor device 1 is manufactured by overlaying and connecting external electrode terminals 43 of semiconductor device 40 in the upper layer on and to connecting connection pads 27 of connecting wires 26 which are located on the top surface of first sealing body 25 of semiconductor device 10 in the lower layer. External electrode terminal 43 of semiconductor device 40 in the upper layer is formed by, for example, a solder ball made of Sn—Ag—Cu. Accordingly, semiconductor device 40 in the upper layer is positioned and overlaid on semiconductor device 10 in the lower layer, and solder is reflowed and melted for a short time, whereby external electrode terminals 43 are connected to connecting connection pads 27.

Next, a method of manufacturing the stacked type semiconductor device 1 will be described with reference to FIGS. 7A to 15C. FIGS. 7A to 7F are views showing a method of manufacturing the semiconductor device 40 in the upper layer, and FIGS. 8A to 8D are views showing part of a method of manufacturing the semiconductor device 10 in the lower layer. FIGS. 9A to 9D are views showing part of a method of manufacturing the semiconductor device 10 in the lower layer.

First, with reference to FIGS. 7A to 7F, the method of manufacturing the semiconductor device (second semiconductor device) 40 in the upper layer will be described.

Figure 7A:
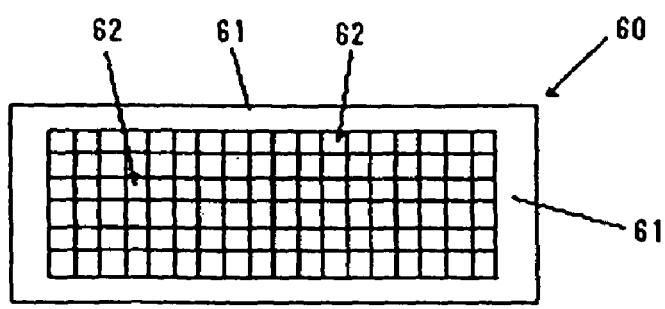
FIGS. 7A to 7F are views showing a process of manufacturing the second semiconductor device.

First, as shown in FIG. 7A, wiring mother board 60 formed from a wiring substrate is prepared. Wiring mother board 60 is partitioned, and includes frame part 61 having a rectangular frame shape, and product forming parts 62 formed to be arranged longitudinally and laterally (matrix form) inside frame part 61. Wiring mother board 60 is cut longitudinally and laterally along the edges of outer perimeters of product forming parts 62 at the final stage of manufacture, and each of product forming parts 62 becomes semiconductor device 40 in the upper layer. Accordingly, wiring mother board 60 becomes wiring substrates 41 by being cut. The structure of product forming part 62 is the structure itself of wiring substrate 41 already described in FIGS. 5 and 6, and therefore, description of the structure of product forming part 62 will be omitted. In FIG. 7A, product forming part 62 is shown by a small square. A first surface (top surface) of wiring mother board 60 corresponds to the first surface (top surface) of wiring substrate 41, and a second surface (undersurface) of product forming part 62 also corresponds to the second surface (undersurface) of wiring substrate 41. Accordingly, the first surface and the second surface of wiring mother board 61 and product forming part 62 are described as the first surface and the second surface.

Figure 7B:
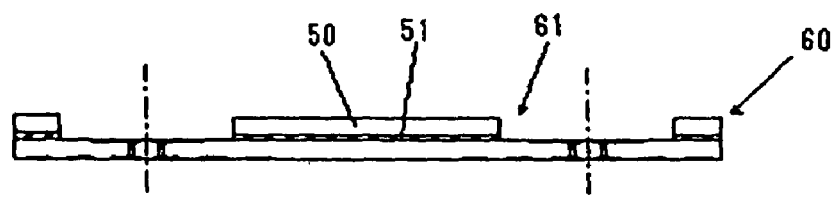

Next, as shown in FIG. 7B, semiconductor chip 50 is fixed to a predetermined position of the first surface of each of production forming parts 62. Since semiconductor chip 50 includes an electrode not illustrated on the first surface, the second surface which is the surface opposite to the first surface, is fixed to the first surface of wiring mother board 60 via insulating adhesive agent 51. In FIGS. 7B to 7E, product forming part 62 is between a pair of adjacent dashed lines.

Figure 7C:
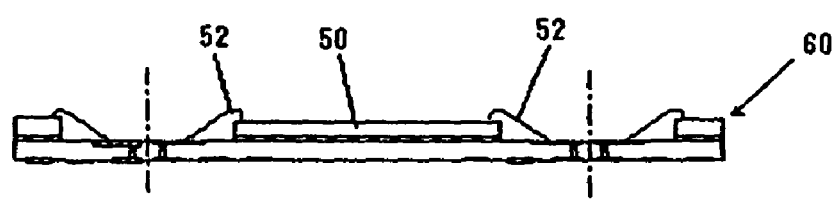

Next, as shown in FIG. 7C, in each of production forming parts 62, the electrodes not illustrated on the first surface of semiconductor chip 50 and connection pads 48 on the first surface of wiring mother board 60 are electrically connected with wires 52.

Figure 7D:
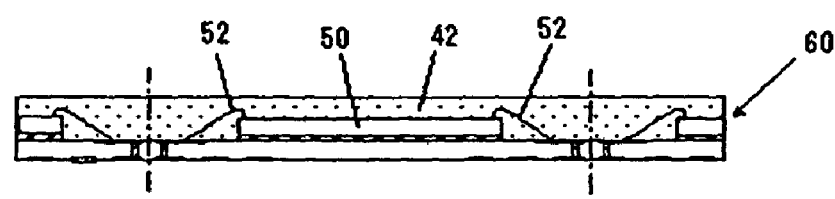

Next, as shown in FIG. 7D, collective molding is performed, and sealing body 42 formed from an insulative resin is formed on the entire region inside frame portion 61 of wiring mother board 60. Sealing body 42 is formed by using, for example, a transfer molding device.

Figure 7E:
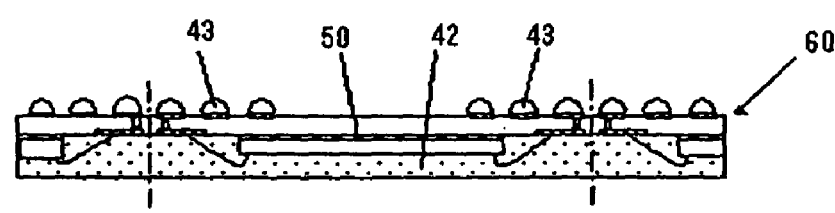
Figure 7F:
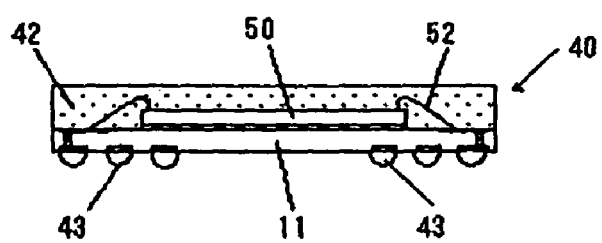

Next, as shown in FIG. 7E, external electrode terminals 43 are formed by being overlaid on terminal formation pads 49 of the second surface of each of product forming parts 62 of wiring mother board 60. External electrode terminal 43 becomes a bump electrode formed by a solder ball having a diameter of 250 µm, for example. In the state of the bump electrode, external electrode terminal 43 has a thickness of 150 µm.

Next, wiring mother board 60 and sealing body 42 are cut at the border line of each of product forming parts 62 and separated into pieces, and semiconductor devices 40 in the upper layer are manufactured. Wiring mother board 60 becomes wiring substrates 41 by the above described cutting.

Figure 8A:
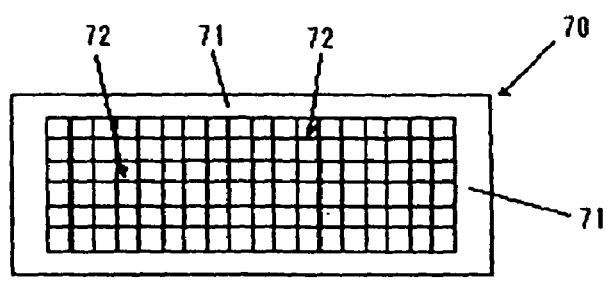
FIGS. 8A to 8D are views showing a process of manufacturing the first semiconductor device.

In manufacture of semiconductor device (first semiconductor device) 10 in the lower layer, wiring mother board 70 formed from a wiring substrate is prepared first as shown in FIG. 8A. Further, a first semiconductor chip and a second semiconductor chip each including a first surface and a second surface to be a surface opposite to the first surface, and including electrodes for wire connection on the first surface, are also prepared.

Wiring mother board 70 is partitioned, and includes frame part 71 that has a rectangular frame shape, and product forming parts 72 which are formed to be arranged longitudinally and laterally (matrix form) inside frame part 71. Wiring mother board 70 is cut longitudinally and laterally along the edges of the outer perimeters of product forming parts 72 at the final stage of manufacture, and each of product forming parts 72 becomes semiconductor device 10 in the lower layer. Accordingly, wiring mother board 70 becomes wiring substrates 11 by being cut. The structure of product forming part 72 is the structure itself of wiring substrate 11 already described in FIGS. 3 and 4, and therefore, description of the structure of product forming part 72 will be omitted. In FIG. 8A, product forming part 72 is shown by a small square. A first surface (top surface) of wiring mother board 70 corresponds to the first surface (top surface) of wiring substrate 11, and a second surface (undersurface) of product forming part 72 also corresponds to the second surface (undersurface) of wiring substrate 11. Accordingly, the first surface and the second surface of wiring mother board 70 and product forming part 72 are described as the first surface and the second surface.

Figure 8B:
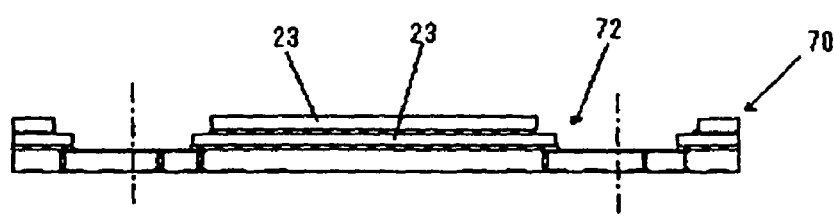

Next, as shown in FIG. 8B, first semiconductor chip 19 is fixed to a predetermined position of the first surface of each of production forming parts 72 via insulative adhesive agent 20. Second semiconductor chip 23 is fixed to a first surface of first semiconductor chip 19 via insulative adhesive agent 22. Thereby, first semiconductor chip 19 and second semiconductor chip 23 are mounted on product forming part 72 of the wiring mother board. In FIGS. 8B to 8D and FIGS. 9A to 9C, product forming part 72 is between a pair of adjacent dashed lines.

Figure 8C:
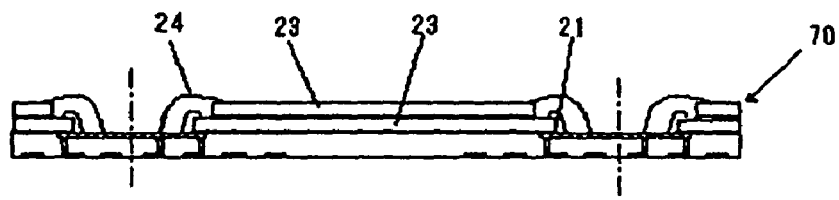

Next, as shown in FIG. 8C, electrodes of first semiconductor chip 19 and connection pads 17 provided in wiring mother board 70 in the area outside of first semiconductor chip 19 are connected with conductive wires 21, and electrodes of second semiconductor chip 23 and connection pads 17 are connected with conductive wires 24. Consideration is given to making the height of semiconductor device 10 in the lower layer as low as possible by making the loop height of wire 24 as low as 100 µm or less from the top surface of second semiconductor chip 23. In the exemplary embodiment, second semiconductor chip 23 is made smaller than first semiconductor chip 19, and the entire body is located inside from the edge of the outer periphery of first semiconductor chip 19, but as long as there is no problem in connecting wires to the electrodes of second semiconductor chip 23, second semiconductor chip 23 may be of such a size that the edge of the outer periphery of second semiconductor chip 23 is projected from the edge of the outer periphery of first semiconductor chip 19.

Figure 8D:
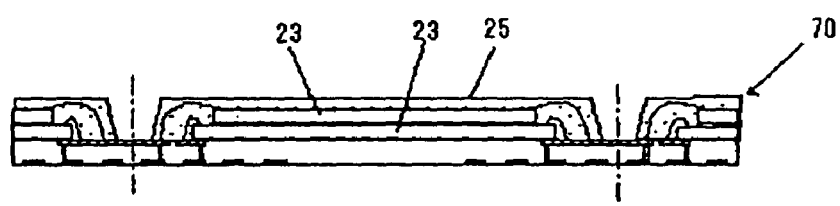

Next, as shown in FIG. 8D, independent first sealing body 25 is formed on the first surface of each of product forming parts 72 of wiring mother board 70. First sealing body 25 is formed of an insulative resin, and covers first semiconductor chip 19, second semiconductor chip 23, wires 21 and 24 and the like. First sealing body 25 is formed by using, for example, a transfer molding device. First sealing bodies 25 are formed by injecting a resin from the bottom portions of cavities, individually in the cavities (recesses) of a mold die in the transfer molding device to form first sealing bodies 25. In first sealing body 25, the exposed portion is configured by a top surface and side surfaces connecting to the top surface are inclined to extend to the first surface of product forming part 72. Further, part of wiring 14 of the first surface of product forming part 72 is outside of first sealing body 25 and thus exposed.

Figure 9A:
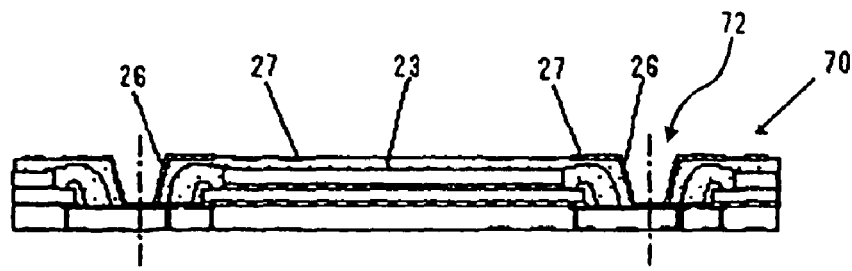
FIGS. 9A to 9D are views showing the process of manufacturing the first semiconductor device.

Next, as shown in FIG. 9A, in each of product forming parts 72, connecting wires 26 that extend from the first surface of product forming part 72 to the side surfaces and top surface of sealing body 12 are formed. Connecting wires 26 are overlaid on wiring 14 which is outside of first sealing body 25 and exposed, and electrically connected to wiring 14, as shown in FIG. 4. Tip end portions of connecting-wires 26 that extend to the top surface of first sealing body 25 become connecting connection pads 27 (see FIG. 3). A top of connecting connection pad 27 becomes a terminal onto which external electrode terminal 43 on the undersurface of semiconductor device 40 in the upper layer is overlaid and connected.

Figure 10:
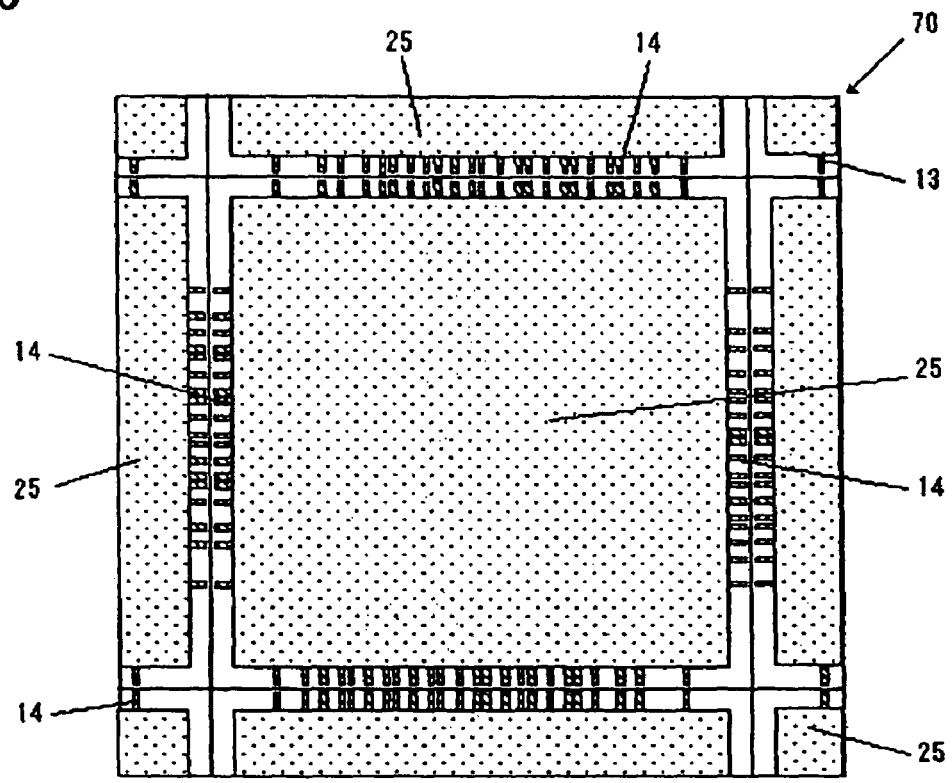
FIG. 10 is a plane view of a product forming part showing a state of forming a first sealing body on a wiring mother board in the process of manufacturing the first semiconductor device.

Here, a method for forming connecting wires 26 will be described with reference to FIGS. 10 to 14. FIG. 10 is a plane view of product forming part 72 showing a state in which first sealing body 25 is formed on wiring mother board 70 in the process of manufacturing the semiconductor device 10 in the lower layer. The lines drawn to be projected respectively from the perimeter sides of square sealing body 12 show wiring 14.

Figure 11:
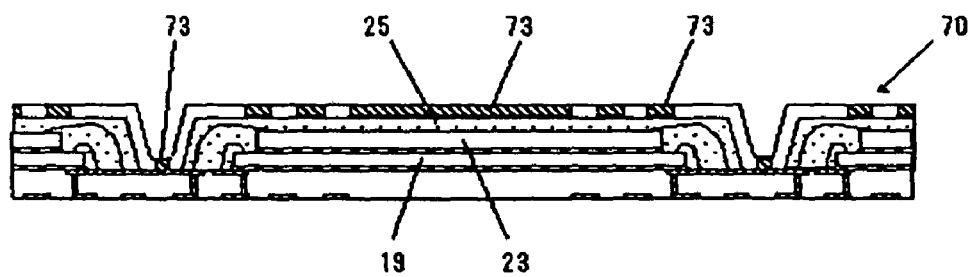
Figure 12:
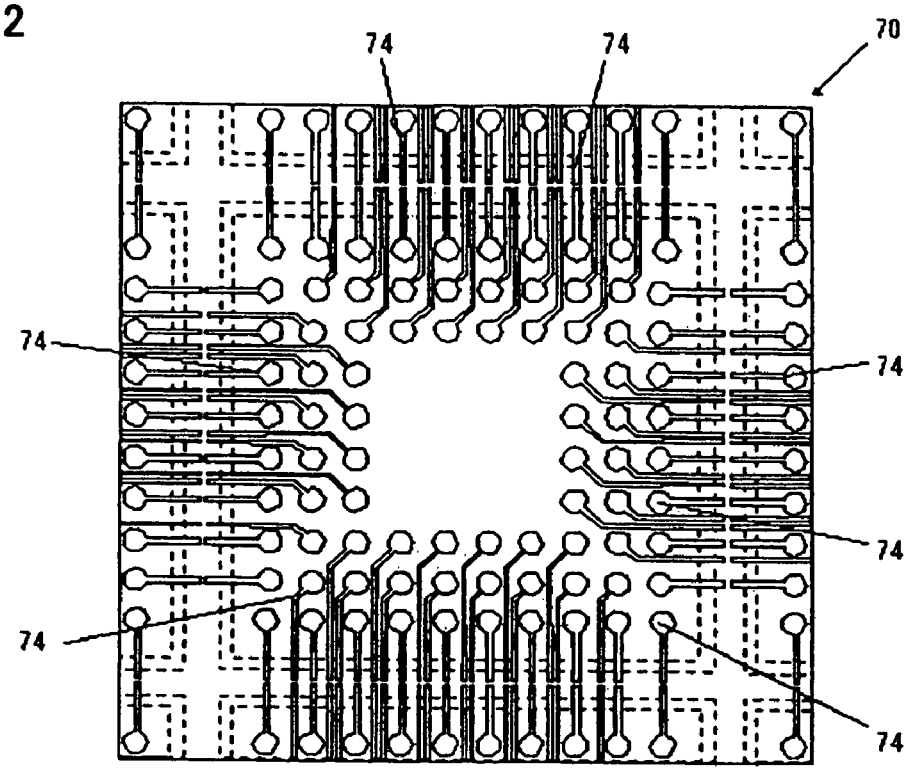

First, mask 73 is formed on the first surface of wiring mother board 70. FIG. 11 is a sectional view showing product forming part 72 of wiring mother board 70 in a state in which mask 73 is formed on first sealing body 25 and the like, and FIG. 12 is a plane view. In FIG. 11, masks 73 are expressed by diagonally shaded portions, and are located on the surface of first sealing body 25 and on the first surface of wiring mother board 70. Mask 73 is made up of a structure capable of being in close contact with the surface of first sealing body 25 and the first surface of wiring mother board 70 by patterning and forming a piece of metal plate made of aluminum, stainless steel or the like. In FIG. 12, circles and portions that connect to the circles are through-holes (slits) 74. The pattern is such that each of slits 74 corresponds to each of connecting wires 26 and to each of connecting connection pads 27. A tip end portion of a straight line portion of slit 74 is overlaid on wiring 14.

Figure 13:
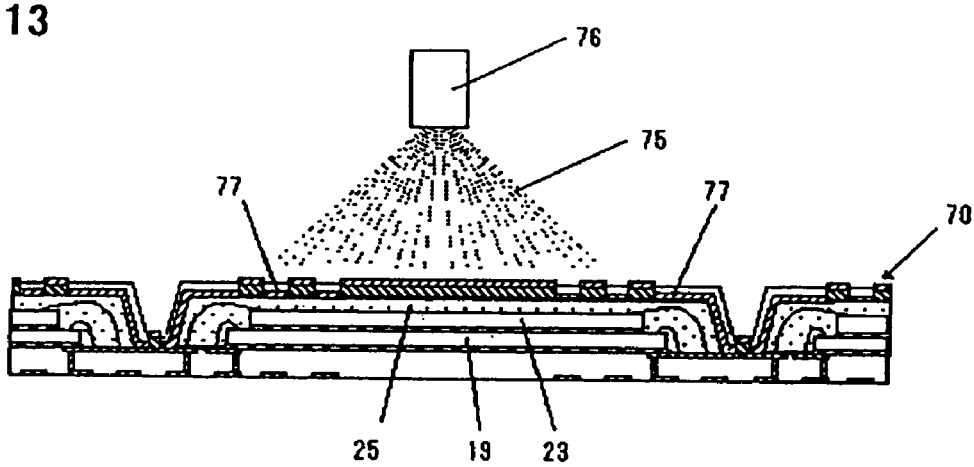
FIG. 13 is a view showing a step of forming an ink layer having a uniform thickness by uniformly coating ink including metal particles with an inkjet nozzle onto an entire first surface of the product forming part of the wiring mother board.

Next, as shown in FIG. 13, ink 75 including metal particles (for example, copper particles) is uniformly coated (sprayed) onto an entire region on the first surface of product forming part 72 of wiring mother board 70 with inkjet nozzle 76 to form ink layer 77 having a uniform thickness.

Next, mask 73 is removed from wiring mother board 70 so as not to impair the shape of ink layer 77 filled in slits 74.

Figure 14:
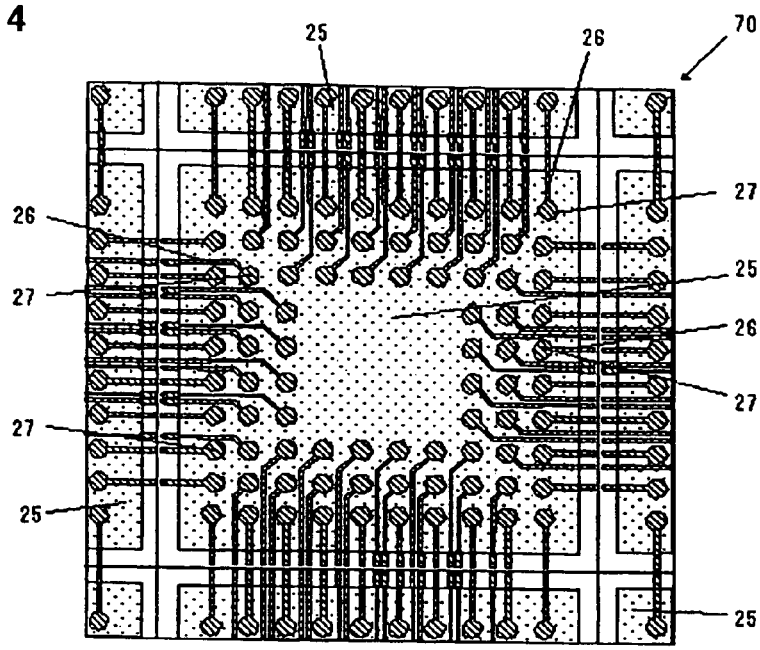
FIG. 14 is a plane view showing connecting wires and connecting pads formed on the wiring mother board and the first sealing body.

Next, ink layer 77 which remains on the surfaces of wiring mother board 70 and first sealing body 25 is cured. Curing is performed at, for example, a temperature of 160 to 170° C. for 30 minutes. By curing, organic components such as a binder included in the ink are removed, a conductor layer is formed, and connecting wires 26 and connecting connection pads 27 are formed as shown in FIG. 14. Connecting wire 26 which passes the side surfaces from the top surface of first sealing body 25 to extend to the first surface of product forming part 72 is made up of a structure overlaid on wiring 14 and is electrically connected to wiring 14 as shown in FIG. 4. Thereby, each wiring 14 exposed on the outer side of first sealing body 25 is led onto the top surface of first sealing body 25 by each of connecting wires 26, and therefore, connecting connection pad 27 on the top surface of first sealing body 25 becomes a lead terminal of each wiring 14.

Figure 9B:
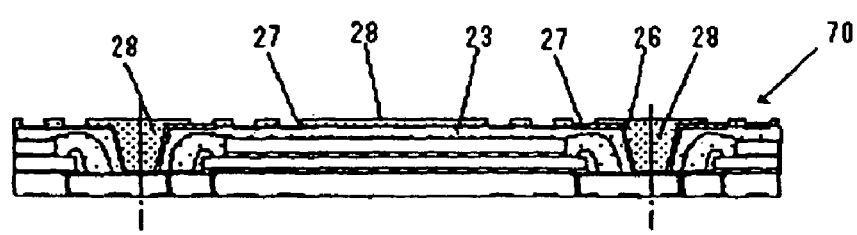

Next, as shown in FIG. 9B, second sealing body 28 covering connecting wires 26 is formed on the first surface of wiring mother board 70 and first sealing body 25. Second sealing body 28 is formed by transfer molding, and has a structure which as a square shape. Further, as shown in FIG. 4, connecting connection pads 27 provided on the top surface of first sealing body 25 are configured to be exposed from second sealing body 28.

Figure 15A:
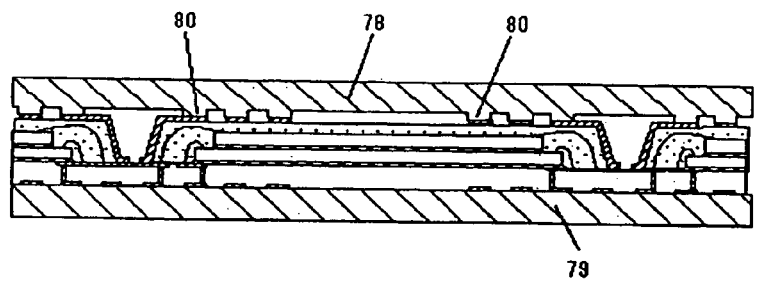
FIGS. 15A to 15C are views showing a step of forming a second sealing body on the wiring mother board.
Figure 15B:
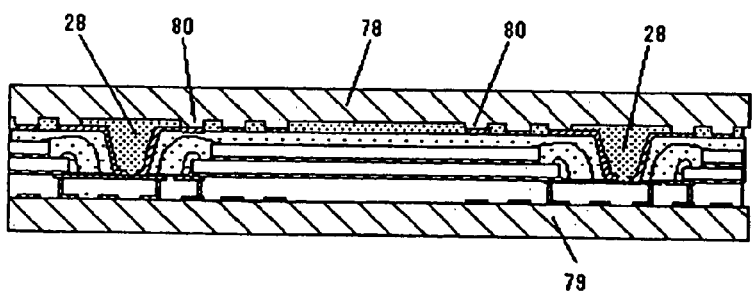
Figure 15C:
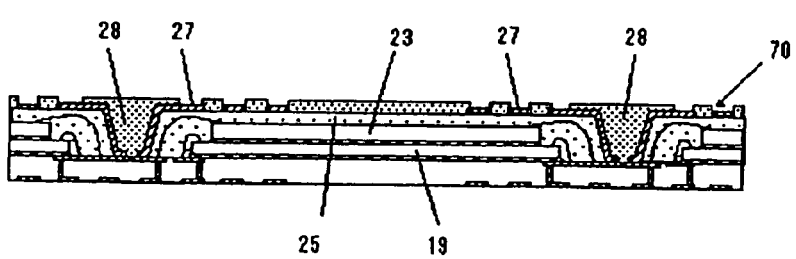

Here, a forming method of second sealing body 28 will be described with reference to FIGS. 15A to 15C. FIGS. 15A to 15C are sectional views of product forming part 72 showing the flow of forming second sealing body 28 on wiring mother board 70, in the manufacture of semiconductor device 10 in the lower layer.

After connecting wires 26 and connecting connection pads 27 are formed on first sealing body 25 from the wiring mother board, wiring mother board 70 is positioned and disposed between upper die 78 and lower die 79 of the mold die in a transfer molding device. Projected portions 80 are provided in upper die 78 of the transfer molding device. Projected portions 80 of the upper die are respectively placed at regions corresponding to connecting connection pads 27 of first sealing body 25. When wiring mother board 70 is clamped by upper die 78 and lower die 79, projected portions 80 of upper die 78 are brought into contact with connecting connection pads 27 formed on first sealing body 25 of wiring mother board 70 respectively.

Next, a resin is injected into a space formed by clamped upper die 78 and lower die 79 from a gate of the mold die that is not illustrated. As shown in FIG. 15B, after the resin is filled, the resin is cured by heating. After the resin is cured, wiring mother board 70 is removed from the mold die. Here, second sealing body 28 is formed in a state in which projected portions 80 of upper die 78 are in close contact with connecting connection pads 27 formed on first sealing body 25, and therefore, the structure in which connecting connection pads 27 are exposed from the top portion of second sealing body 28 is provided. Second sealing body 28 is suitable if it only covers the connecting wiring, and may be formed by potting or the like. The external electrode terminals on the undersurface of semiconductor device 40 in the upper layer can be overlaid on and connected to connecting connection pads 27 thus exposed.

Figure 9C:
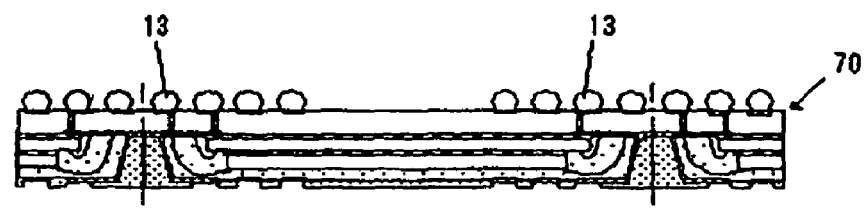

Next, as shown in FIG. 9C, external electrode terminals 13 are formed by being overlaid on terminal formation pads 18 of the second surface of each of product forming parts 72 of wiring mother board 70. External electrode terminal 13 becomes a bump electrode formed by, for example, a solder ball having a diameter of 250 µm. In the state of the bump electrode, external electrode terminal 13 has a thickness of 200 μm. Since connecting wires 26 are covered with second sealing body 28, adherence of foreign matter to connecting wires 26, wire breakage and removal in the step of forming the external terminals and the like, and in the subsequent steps can be prevented, and handling of the wiring mother board is facilitated.

Figure 9D:
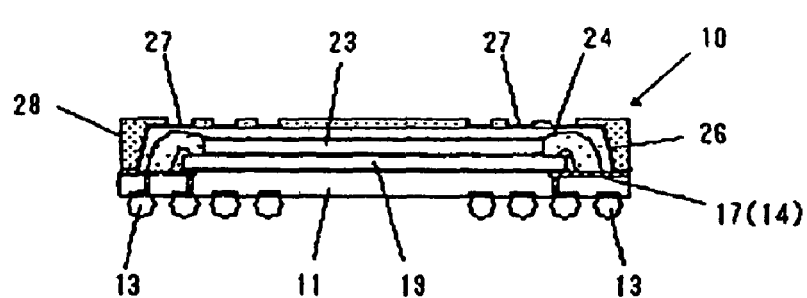

Next, wiring mother board 70 is cut at the border lines of each of product forming parts 72 to be separated into pieces, and semiconductor devices 10 in the lower layer are manufactured as shown in FIG. 9D. Wiring mother board 70 becomes wiring substrates 11 by being cut as described above. The above described cutting is performed by a dicing device, not illustrated, in a state in which the second sealing body of the wiring mother board is bonded and fixed to a dicing tape not illustrated, for example, and respective semiconductor devices 10 are separated into pieces. Here, by providing second sealing body 28, the wiring is not directly bonded and fixed to the dicing tape, and removal of the wiring can be reduced.

Next, semiconductor device 40 in the upper layer is positioned on semiconductor device 10 in the lower layer. Thereafter, semiconductor device 40 in the upper layer is overlaid on semiconductor device 10 in the lower layer, and external electrode terminals 43 of semiconductor device 40 in the upper layer are temporarily heated (reflowed) to be connected to connecting connection pads 27 on the top surface of first sealing body 12 of semiconductor device 10 in the lower layer. Thereby, stacked type semiconductor device 1 as shown in FIGS. 1 and 2 is manufactured.

According to the exemplary embodiment, the following effects can be obtained.

(1) In semiconductor device 10 in the lower layer, part of wiring 14 on the top surface (first surface) of wiring substrate 11 provided with first sealing body 25 is exposed on the outer side of first sealing body 25, and connecting wires 26 electrically connected to the exposed wiring 14 are disposed to be, extended onto the top surface of first sealing body 25. Connecting wires 26 are covered with second sealing body 28, and the connecting connection pads are exposed on the top surface of the semiconductor device in the lower layer. The structure is formed, in which electrodes (external electrode terminals) 43 of the undersurface (the second surface of wiring substrate 41) of semiconductor device 40 in the upper layer are electrically connected to respective connecting connection pads 27 exposed from the top surface of second sealing body 28. When semiconductor chips (for example, first semiconductor chip 19 and second semiconductor chip 23) are mounted in layers in first sealing body 25 of semiconductor device 10 in the lower layer, the thickness (height) of the sealing body inevitably increases. However, since the structure in which electrodes 43 of semiconductor device 40 in the upper layer are connected by being overlaid on the connecting wiring portions (connecting connection pads 32) provided on the top surface of the first sealing body of semiconductor device 10 in the lower layer is adopted, the thickness (height) of electrode (external electrode terminal) 43 of semiconductor device 40 in the upper layer can be made thin without being influenced by the thickness of sealing body 12 of semiconductor device 10 in the lower layer. As a result, a reduction in thickness of stacked type semiconductor device 1 can be achieved. Electrode (external electrode terminal) 43 of semiconductor device 40 in the upper layer is a bump electrode formed by, for example, a solder ball or the like, and the solder ball can be also formed into a diameter of about 200 to 300 μm. Therefore, a reduction in thickness of stacked type semiconductor device 1 can be achieved.

(2) In semiconductor device 10 in the lower layer, part of wiring 14 on the top surface (first surface) of wiring substrate 11 provided with the first sealing body is exposed to the outside from first sealing body 25, and therefore, the outer peripheral portion of wiring substrate 11 is made up of a structure projected outside first sealing body 25. The projected length of wiring substrate 11 projected from the edge of the outer periphery of the first sealing body is sufficient if just wiring 14 provided at wiring substrate 11 and connecting wires 26 can be electrically connected, and therefore, the projected length of the outer peripheral portion of the wiring substrate can be made short as compared with the structure in which bump electrodes are disposed. Thus, a reduction in size of stacked type semiconductor device 1 can be achieved.

(3) In semiconductor device 10 in the lower layer, second sealing body 28 which covers at least wiring substrate 11 and connecting wires 26 provided on the top surface of first sealing body 25 is provided. Thereby, the top surface of second sealing body 28 is configured so that connecting connection pads 27 are exposed. Therefore, shorting due to foreign matter adhering to connecting wire 26, wire breakage due to contact with connecting wires 26 and the like in the steps after forming connecting wires 26, and the like can be prevented, and reliability of the semiconductor device can be improved.

(4) According to the above descriptions (1) to (3), a reduction in the size and thickness of stacked type semiconductor device 1 can be achieved with high reliability.

(5) On each of semiconductor device 10 in the lower layer and semiconductor device 40 in the upper layer, semiconductor chips can be mounted by being stacked on them, and therefore, high-density and high integration stacked type semiconductor device 1 is provided.

(6) Semiconductor device 10 in the lower layer is made up of a structure in which the connecting portions (connecting wiring portions: connecting connection pads 27) for connecting to semiconductor device 40 in the upper layer are disposed on top surface 29 of sealing body 12. Therefore, there is no limitation in disposition of the connecting portions, and the degree of freedom of design of stacked type semiconductor device 1 increases.

Second Exemplary Embodiment

FIGS. 16A to 16D are views according to a method of manufacturing a semiconductor device according to a second exemplary embodiment. The second exemplary embodiment relates to another method for forming second sealing body 28 which covers connecting wires 26 of semiconductor device 10 in the lower layer according to the method of manufacturing a semiconductor device of the first exemplary embodiment.

Figure 16A:
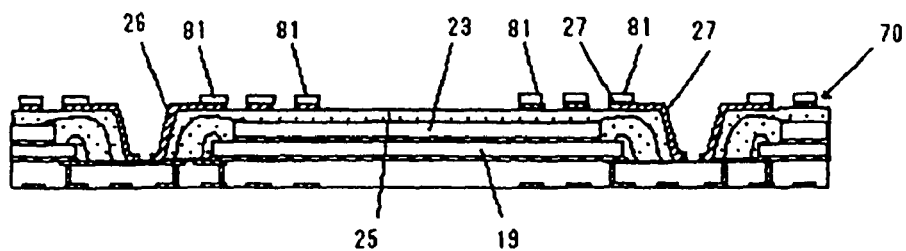
FIGS. 16A to 16D are views showing a method of manufacturing a semiconductor device according to a second exemplary embodiment.

The steps until the step of forming connecting wires 26 on first sealing body 25 are performed similarly to the first exemplary embodiment. Next, in the exemplary embodiment, as shown in FIG. 16A, metal layer 81 that has a predetermined thickness and that is made of solder or the like is formed on each of connecting connection pads 27 formed on first sealing body 25. The thickness of the metal layer is sufficient if it is a thickness which allows a resin to spread to the upper portion of the connecting wires.

Figure 16B:
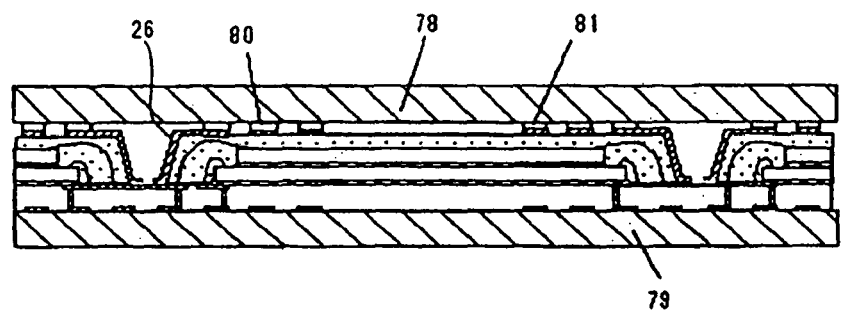

Next, wiring mother board 70 is positioned and disposed between upper die 78 and lower die 79 of a mold die in the transfer molding device. The exemplary embodiment is configured so that the metal layer is provided on connecting wires 26, and therefore, the projected portions provided at the mold die in the first exemplary embodiment are not required. When wiring mother board 70 is clamped by upper die 78 and lower die 79, metal layers 81 provided on connecting wires 26 are brought into contact with upper die 78, and spaces in which a resin spreads can be configured above connecting wires 26 as shown in FIG. 16B.

Figure 16C:
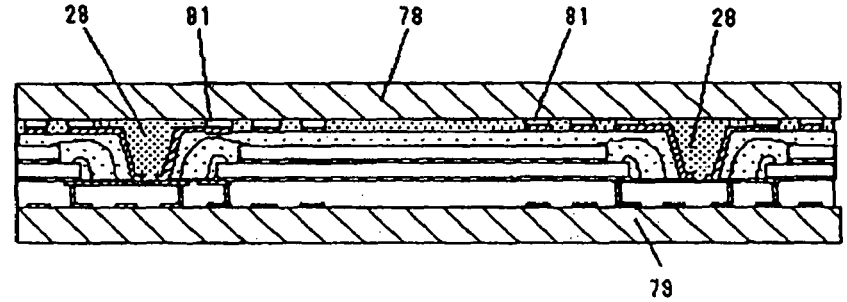
Figure 16D:
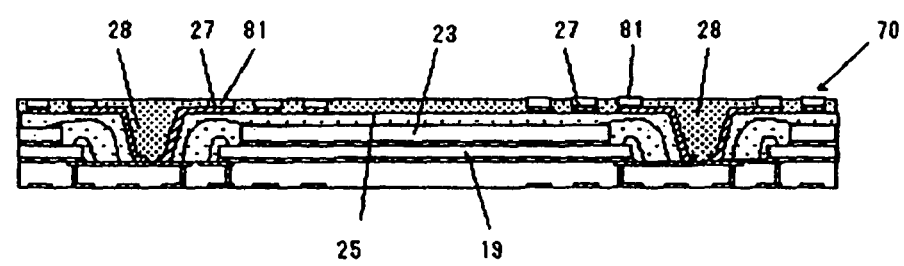

Next, a resin is injected from a gate, not illustrated, of the mold die into the space formed by clamped upper die 78 and lower die 79. As shown in FIG. 16C, after the resin is filled, the resin is cured by heating. After the resin is cured, wiring mother board 70 is taken out of the mold die, whereby the wiring mother board, in which metal layers 81 formed on the connecting connection pads are exposed from the top surface of second sealing body 28, as shown in FIG. 16D, is obtained. Here, the second sealing body is formed in a state in which metal layers 81 formed on connecting wires 26 are in close contact with the mold die, and therefore, the structure in which connecting connection pads 27 are exposed from the top portion of second sealing body 28 is provided. Thereby, the mold die comes into common use.

According to the exemplary embodiment, the configuration, in which the metal layers are formed on the connecting connection pads so that the resin spreads on the connecting connection pads, is adopted, whereby, there is no need to provide projected portions that correspond to the type of the product in the mold die, and productivity can be improved. Thereby, the manufacturing cost of the semiconductor device can be reduced.

Third Exemplary Embodiment

FIGS. 17A to 17D are views based on a method of manufacturing a semiconductor device according to a third exemplary embodiment. The third exemplary embodiment relates to another method for forming second sealing body 28 which covers connecting wires 26 of semiconductor device 10 in the lower layer in the method of manufacturing a semiconductor device of the first exemplary embodiment.

Figure 17A:
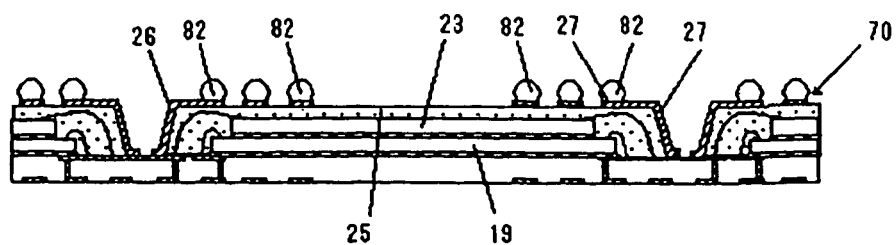
FIGS. 17A to 17D are views showing a method of manufacturing a semiconductor device according to a third exemplary embodiment.

The steps until the step of forming connecting wires 26 on first sealing body 25 are performed similarly to the first exemplary embodiment. Next, in the exemplary embodiment, as shown in FIG. 17A, solder balls 82, which are ball-shaped connecting portions, are respectively mounted on connecting connection pads 27 which are formed on first sealing body 25. Solder balls 82 are bonded and fixed to connecting connection pads 27 via, for example, flux, and mounted by being reflowed.

Figure 17B:
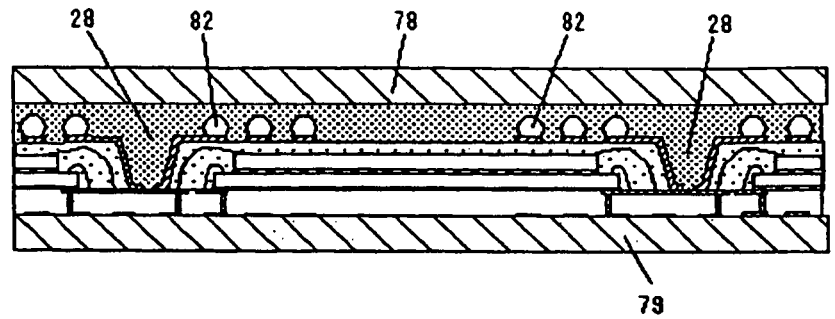
Figure 17C:
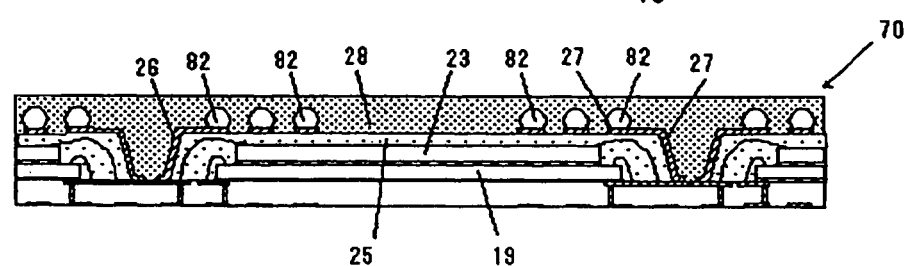

Next, wiring mother board 70 is positioned and disposed between upper die 78 and lower die 79 of the mold die in the transfer molding device. In the exemplary embodiment, sealing is performed so as to cover the solder balls, and therefore, projected portions are not required in the mold die. Wiring mother board 70 is clamped by upper die 78 and lower die 79, and a resin is injected into a space which is formed by clamped upper die 78 and lower die 79 from a gate, not illustrated, of the mold die. As shown in FIG. 17B, after the resin is filled, the resin is cured by heating. After the resin is cured, wiring mother board 70 is taken out of the mold die, whereby second sealing body 28, which covers the entire top surface of wiring mother board 70, and first sealing body 25 are formed as shown in FIG. 17C. The solder balls which are formed on connecting connection pads 27 are also covered with the second sealing body.

Figure 17D:
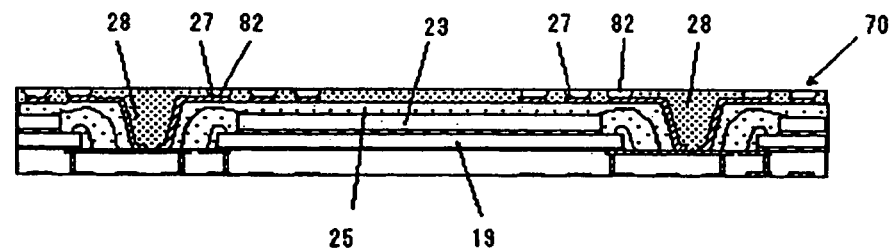

Next, second sealing body 28 of the wiring mother board is ground, and the solder balls which are mounted on the connecting connection pads are exposed from the top surface of second sealing body 28. Thereby, as shown in FIG. 17D, solder balls are exposed from the top surface of the second sealing body. The external electrode terminals of semiconductor device 40 in the upper layer are connected to the exposed solder balls, whereby the semiconductor device in the lower layer is electrically connected to the semiconductor device in the upper layer.

According to the exemplary embodiment, in the configuration in which the solder balls are mounted on the connecting connection pads, sealing is performed to completely cover the solder balls, whereby the projected portions to correspond to the type of the product do not have to be provided in the mold die, and productivity can be improved. Further, a configuration which does not need resin sealing of the narrow spaces is adopted, and flowability of the resin can be improved. Further, the top surface of second sealing body 28, the mounting surface for the semiconductor device in the upper layer are formed by grinding, and therefore, flatness of the mounting surface for the semiconductor device in the upper layer can be improved.

The invention made by the present inventors is described in detail above based on the exemplary embodiments, but it goes without saying that the present invention is not limited to the above described exemplary embodiments and various modifications can be made without departing from the spirit of the present invention.

For example, in the exemplary embodiment, a case in which the connecting wires and connecting connection pads are formed by mounting the mask on first sealing body 25 and spraying metal particles with inkjet in the manufacture of semiconductor device 10 in the lower layer is described, but the present invention is not limited to this, and the connecting wires and connecting connection pads may be formed by another method in which the connecting wires and connecting connection pads are formed by forming recessed portions in the wire formation portions on first sealing body 25, for example, and by poring metal particles into the recessed portions, and the like.

Further, a case in which the BGA type semiconductor device is stacked as the semiconductor device in the upper layer is described, but the semiconductor device in the upper layer is not limited to this, and a semiconductor device using a lead frame such as QFN or a passive component such as a chip capacitor may be mounted.

What is claimed is:

1. A method of manufacturing a semiconductor device, comprising:
   mounting at least one semiconductor chip on a substrate including a wiring in a predetermined pattern:
   electrically connecting an electrode of said semiconductor chip to said wiring of said wiring substrate via connecting means;
   forming a first sealing body comprising an insulative resin, which covers said semiconductor chip and said connecting means in a state in which a part of said wiring is exposed on a part of said wiring substrate, and which includes a top surface formed above said semiconductor chip and side surfaces extending from the top surface to a surface of said wiring substrate on which said semiconductor chip is mounted;
   providing a plurality of connecting terminals on said top surface of said first sealing body;
   providing a plurality of connecting wires which extend from the surface of said wiring substrate, on which said semiconductor chip is mounted, to said top surface via said side surfaces of said first sealing body, and which electrically connect said wiring of said wiring substrate and said plurality of connecting terminals; and
   forming a second sealing body comprising an insulative resin, which covers said plurality of connecting wires and covers a periphery of a connecting terminal in the plurality of connecting terminals,
wherein the providing the connecting terminals and the providing the connecting wires are carried out at the same time.

2. The method of manufacturing a semiconductor device according to claim 1,
wherein said forming the second sealing body includes disposing said insulative resin to cover peripheries of said plurality of connecting terminals.

3. The method of manufacturing a semiconductor device according to claim 2, further comprising:
forming a plurality of metal layers each having a predetermined thickness, on said plurality of connecting terminals,
wherein said forming the second sealing body includes forming said second sealing body which covers said plurality of connecting wires and the peripheries of said plurality of connecting terminals by causing a mold die to abut on said plurality of metal layers and filling said insulative resin into a space formed between said wiring substrate and said mold die.

4. The method of manufacturing a semiconductor device according to claim 2, further comprising:
forming a plurality of ball-shaped connecting portions on said plurality of connecting terminals,
wherein said forming the second sealing body includes forming an insulative resin on the surface of said wiring substrate on which said semiconductor chip is mounted to cover said plurality of connecting wires, said first sealing body and said plurality of connecting portions completely, curing the insulative resin, and thereafter, grinding a top surface of the insulative resin until said plurality of connecting portions are exposed.

5. The method of manufacturing a semiconductor device according to claim 1, further comprising:
providing an upper package which comprises an upper wiring substrate, an upper semiconductor chip mounted on a first main surface of the upper wiring substrate, an upper sealing body covering the upper semiconductor chip, a plurality of upper external terminals formed on a second main surface of the upper wiring substrate and electrically connected to the upper semiconductor chip, and a plurality of connecting members formed respectively on the upper external terminals; and
stacking the upper package by mounting each of the connecting members on an associated one of the connecting terminals.

6. The method of manufacturing a semiconductor device according to claim 1, wherein the forming of the second sealing body comprises forming the second sealing body to cover peripheries of the plurality of connecting terminals.

7. The method of manufacturing a semiconductor device according to claim 1, wherein the forming of the second sealing body comprises forming the second sealing body on the top surface of the first sealing body and between a plurality of connecting terminals.

8. The method of manufacturing a semiconductor device according to claim 1, wherein the forming of the second sealing body comprises forming the second sealing body in a central portion of the top surface of the first sealing body.

9. The method of manufacturing a semiconductor device according to claim 1, wherein the forming of the second sealing body comprises:
disposing the wiring substrate between an upper die and a lower die, such that projected portions of the upper die are placed at a region of the top surface of the first sealing body corresponding to the plurality of connecting terminals.

10. The method of manufacturing a semiconductor device according to claim 9, wherein the forming of the second sealing body comprises:
injecting the insulative resin into a space between the upper die and the top surface of the first sealing body.

11. The method of manufacturing a semiconductor device according to claim 1, wherein the second sealing body is formed on the top surface of the first sealing body and secures the plurality of connecting terminals to the top surface of the first sealing body.

12. A method of manufacturing a semiconductor device, comprising:
mounting at least one semiconductor chip on a wiring substrate including a wiring in a predetermined pattern;
electrically connecting an electrode of said semiconductor chip to said wiring of said wiring substrate via connecting means;
forming a first sealing body comprising an insulative resin, which covers said semiconductor chip and said connecting means in a state in which a part of said wiring is exposed on a part of said wiring substrate, and which includes a top surface formed above said semiconductor chip and side surfaces extending from the top surface to a surface of said wiring substrate on which said semiconductor chip is mounted;
providing a plurality of connecting terminals on said top surface of said first sealing body;
providing a plurality of connecting wires which extend from the surface of said wiring substrate, on which said semiconductor chip is mounted, to said top surface via said side surfaces of said first sealing body, and which electrically connect said wiring of said wiring substrate and said plurality of connecting terminals; and
forming a second sealing body comprising an insulative resin, which covers said plurality of connecting wires and covers a periphery of a connecting terminal in the plurality of connecting terminals,
wherein the providing the connecting terminals and the providing the connecting wires comprise:
placing a mask including slits that correspond respectively to the connecting terminals and the connecting wires over the wiring of the wiring substrate, the mask overlying and adhering to the first surface and the side surfaces and the top surface of the first sealing body;
applying an ink that contains metal particles in a predetermined thickness over the entire area of the wiring substrate; and
removing said mask from the wiring substrate while leaving respective portions of the ink filling the slits of the mask to form the connecting terminals and the connecting wires by the respective portions of the ink.

13. A method of manufacturing a semiconductor device, comprising:
providing a wiring substrate which comprises a first surface and a second surface opposite to the first surface, the wiring substrate comprising a plurality of product formation areas each having on the first surface a first region and a plurality of connection pads outside of the first region:
providing a plurality of semiconductor chins on the wiring substrate such that each of the semiconductor chips is mounted on the first region of an associated one of the product formation areas;

electrically connecting each of the semiconductor chips to the connection pads of an associated one of the product formation areas;

forming a plurality of first sealing bodies each covering an associated one of the semiconductor chins while keeping the connection pads on the wiring substrate uncovered, each of the first sealing bodies including a top surface and a side surface extending from the top surface to the product formation area;

forming a plurality of connecting terminals on the top surface of each of the first sealing bodies;

forming a plurality of connecting wires which extend from the connection pads to the connecting terminals of the top surface via the side surface;

forming a second sealing body covering at least the connecting wires and covering a periphery of a connecting terminal in the plurality of connecting terminals; and cutting the wiring substrate and the second sealing body to separate the product formation areas from each other, each comprising associated ones of the semiconductor chips, the first sealing bodies, connecting terminals and the connecting wires, wherein the forming the connecting terminals and the forming the connecting wires are carried out at the same time.

14. The method of manufacturing a semiconductor device according to claim 13, wherein the forming the second sealing body comprises disposing an insulating resin to cover peripheries of the connecting terminals.

15. The method of manufacturing a semiconductor device according to claim 14, further comprising:

forming a plurality of metal layers each having a predetermined thickness, on said connecting terminals, wherein the forming the second sealing body comprises causing a mold die to abut on the metal layer and the insulating resin to fill a space between the wiring substrate and the mold die, the insulating resin thereby covering the connecting wires and the peripheries of the connecting terminals.

16. The method of manufacturing a semiconductor device according to claim 13, further comprising:

forming a plurality of ball-shaped connecting portions on the connecting terminals, wherein the forming the second sealing body comprises forming an insulating resin to cover the connecting wires, the first sealing body and the ball-shaped connecting portions completely, curing the insulating resin, and thereafter, grinding the top surface of the insulating resin until respective parts of the ball-shaped connecting portions are exposed.

* * * * *